United States Patent
Kim et al.

(10) Patent No.: US 8,298,447 B2
(45) Date of Patent: Oct. 30, 2012

(54) CONDUCTIVE PASTE, PRINTED CIRCUIT BOARD, AND MANUFACTURING METHOD THEREOF

(75) Inventors: Ki-Hwan Kim, Boryeong-si (KR); Jee-Soo Mok, Yongin-si (KR); Myung-Sam Kang, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1095 days.

(21) Appl. No.: 12/076,117

(22) Filed: Mar. 13, 2008

(65) Prior Publication Data

US 2008/0314619 A1    Dec. 25, 2008

(30) Foreign Application Priority Data

Jun. 22, 2007   (KR) .................. 10-2007-0061835

(51) Int. Cl.
*H01B 1/02* (2006.01)
*H01B 1/22* (2006.01)
*B32B 37/00* (2006.01)
*B29C 44/34* (2006.01)
*C08J 9/22* (2006.01)

(52) U.S. Cl. ......... 252/513; 252/514; 264/45.4; 264/51; 521/57

(58) Field of Classification Search ....... 252/500–521.6; 264/45.4, 51; 521/57
See application file for complete search history.

(56) References Cited

U.S. PATENT DOCUMENTS

| | | | | |
|---|---|---|---|---|
| 3,629,774 A * | 12/1971 | Crites | ............ | 338/114 |
| 4,158,031 A * | 6/1979 | Reuter et al. | ............ | 521/57 |
| 4,231,901 A * | 11/1980 | Berbeco | ............ | 252/511 |
| 4,505,973 A * | 3/1985 | Neet et al. | ............ | 428/317.9 |
| 4,629,585 A * | 12/1986 | McCracken et al. | ............ | 252/511 |
| 4,931,479 A * | 6/1990 | Morgan | ............ | 521/76 |
| 5,151,222 A * | 9/1992 | Ruffoni | ............ | 252/511 |
| 6,479,763 B1 * | 11/2002 | Igaki et al. | ............ | 174/262 |
| 7,101,608 B1 * | 9/2006 | Karnes | ............ | 428/158 |

FOREIGN PATENT DOCUMENTS

| | | |
|---|---|---|
| JP | 2000-215729 | 8/2000 |
| JP | 2001-217548 | 8/2001 |
| JP | 2007-13208 | 1/2007 |

OTHER PUBLICATIONS

Korean Patent office Action, mailed Sep. 18, 2008 and issued in corresponding Korean Patent Application No. 10-2007-0061835.
Japanese Office Action issued Sep. 20, 2011 in corresponding Japanese Patent Application 2008-159184.

* cited by examiner

*Primary Examiner* — Mark Kopec
*Assistant Examiner* — Jaison Thomas

(57) ABSTRACT

A conductive paste, a printed circuit board using the conductive paste, and a method of manufacturing the printed circuit board are disclosed. A conductive paste that includes conductive particles, a polymer, and a polymer foam, can reduce the number of printing repetitions, to simplify the manufacturing process, decrease process times, and improve reliability.

19 Claims, 11 Drawing Sheets

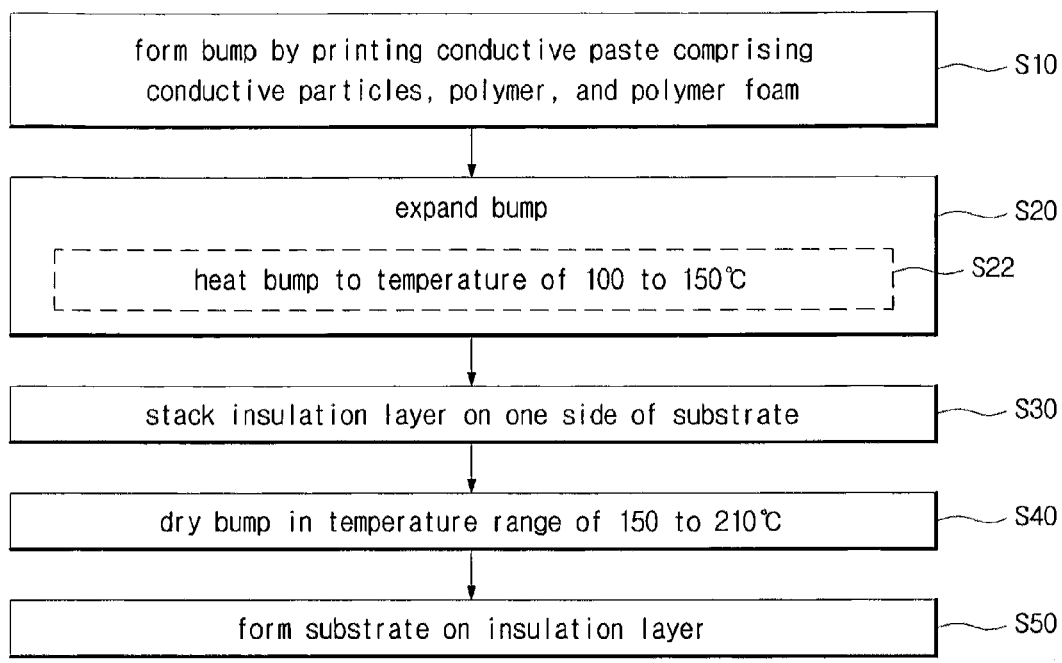

CONDUCTIVE PASTE, PRINTED CIRCUIT BOARD, AND MANUFACTURING METHOD THEREOF

CROSS-REFERENCE TO RELATED APPLICATIONS

This application claims the benefit of Korean Patent Application No: 10-2007-0061835 filed with the Korean Intellectual Property Office on Jun. 22, 2007, the disclosure of which is incorporated herein by reference in its entirety.

BACKGROUND

1. Technical Field

The present invention relates to a conductive paste, a printed circuit board using the conductive paste, and to a method of manufacturing the printed circuit board.

2. Description of the Related Art

Conductive adhesive, used in mounting components onto a substrate or in interconnecting electrodes, has the purpose of securing and electrically connecting an object. As such, a typical form of conductive adhesive has conductive metal particles, such as of silver or copper, etc., dispersed in a paste of viscous resin or hardening resin.

For proper adhesion, it is important that the adhesive and the surface of the object being attached be sufficiently close together, to the level of micrometers. In the case of a viscous type resin, the resin commonly used is one that is readily altered into a moldable state, whereas in the case of a hardening type resin, the resin commonly used is one that has high fluidity and high wetting properties.

As such, in either case of using a viscous type or hardening type resin, the adhesive can flow into the micro-level irregularities in the object being attached, and can thus provide adequate adhesion.

The conductive particles may have various shapes according to their usage. In either case of the viscous type or hardening type resin, since a low resistance is required for adequate electrical connection, it may be needed to increase the content of conductive particles within the adhesive, remove bubbles, and increase the volume occupied by the conductive materials.

In the conductive adhesive of the related art, the conductivity is maintained by contact between the conductive particles. Here, stress may be created, such as when the object being attached is expanded or contracted by heat, or when the board to which the adhesive is applied is bent. When the stress is relieved, the contact between particles can become misadjusted, whereby the resistance can be increased.

The conductive paste currently used for interlayer connection generally has the form of a mixture of polymers and silver particles. The conductive paste can be used to form bumps on an aluminum board, by repeating the printing process until the bumps are formed to a target height and shape. With this kind of paste, conical bumps of a desired height and diameter may typically be formed after repeating the printing four to five times.

Afterwards, drying and penetration processes can be used to implement the connection between layers. In the above series of processes, the repeated printing of the paste can lead to delayed process times, complicated processes, and a greater risk of the bumps spreading.

SUMMARY

An aspect of the invention is to provide a conductive paste, a printed circuit board using the conductive paste, and a method of manufacturing the printed circuit board, with which the number of printing repetitions can be reduced, to simplify the manufacturing process, decrease process times, and improve reliability.

One aspect of the invention provides a conductive paste that includes conductive particles, a polymer, and a polymer foam.

The content of the conductive particles can be 80 to 90 parts by weight per 100 parts by weight of the conductive paste, while the content of a mixture of the polymer and the polymer foam can be 10 to 20 parts by weight per 100 parts by weight of the conductive paste. The conductive particles may include such elements as silver, copper, tin, indium, and nickel, etc.

The polymer may include at least one of an epoxy resin and a phenol-melamine resin.

The polymer foam may contain a foaming material, which expands and creates foam when heated to a predetermined temperature, where the predetermined temperature can be within a temperature range of 100 to 150° C. A surface of the polymer foam can be coated with the conductive particles.

Also, the foaming material may include a material that can be made supercritical, such as hydrocarbons, alcohols, $CO_2$, $N_2O$, $H_2O$, and $NH_3$.

Another aspect of the invention provides a printed circuit board, which includes more than one substrates, an insulation layer placed between the substrates, and a bump that penetrates the insulation layer and interconnects the substrates, where the bump is made from a conductive paste that includes conductive particles, a polymer, and a polymer foam.

The content of the conductive particles can be 80 to 90 parts by weight per 100 parts by weight of the conductive paste, while the content of a mixture of the polymer and the polymer foam can be 10 to 20 parts by weight per 100 parts by weight of the conductive paste. The conductive particles may include such elements as silver, copper, tin, indium, and nickel, etc.

The polymer may include at least one of an epoxy resin and a phenol-melamine resin.

The polymer foam may contain a foaming material, which expands and creates foam when heated to a predetermined temperature, where the foaming material may include a material that can be made supercritical, such as hydrocarbons, alcohols, $CO_2$, $N_2O$, $H_2O$, and $NH_3$.

Here, the predetermined temperature can be within a temperature range of 100 to 150° C. A surface of the polymer foam can be coated with the conductive particles.

Yet another aspect of the invention provides a method of manufacturing a printed circuit board that includes a first substrate and a second substrate stacked together with an insulation interposed in-between, and a bump penetrating the insulation layer to electrically connect the first substrate and the second substrate. The method includes: forming the bump on one side of the first substrate by printing a conductive paste, which includes conductive particles, a polymer, and a polymer foam; expanding the bump; stacking the insulation layer on the one side of the first substrate; and forming the second substrate on the insulation layer.

The content of the conductive particles can be 80 to 90 parts by weight per 100 parts by weight of the conductive paste, while the content of a mixture of the polymer and the polymer foam can be 10 to 20 parts by weight per 100 parts by weight of the conductive paste.

The conductive particles may be made of at least one selected from a group consisting of silver, copper, tin, indium, and nickel, while the polymer may include at least one of an epoxy resin and a phenol-melamine resin.

A surface of the polymer foam can be coated with the conductive particles.

Expanding the bump can be performed by heating the bump to a predetermined temperature, which can be a temperature within the range of 100 to 150° C.

Also, for the operation of expanding the bump, the polymer foam can contain a foaming material that expands and creates foam. The foaming material may include a material that can be made supercritical, such as hydrocarbons, alcohols, $CO_2$, $N_2O$, $H_2O$, and $NH_3$.

In certain embodiments, an operation of drying the bump can further be included after the stacking of the insulation layer on the one side of the first substrate, which can be performed within a temperature range of 150 to 210° C.

Additional aspects and advantages of the present invention will be set forth in part in the description which follows, and in part will be obvious from the description, or may be learned by practice of the invention.

BRIEF DESCRIPTION OF THE DRAWINGS

FIG. 4 is a flowchart of a method of manufacturing a printed circuit board according to an embodiment of the invention.

DETAILED DESCRIPTION

Figure 1:
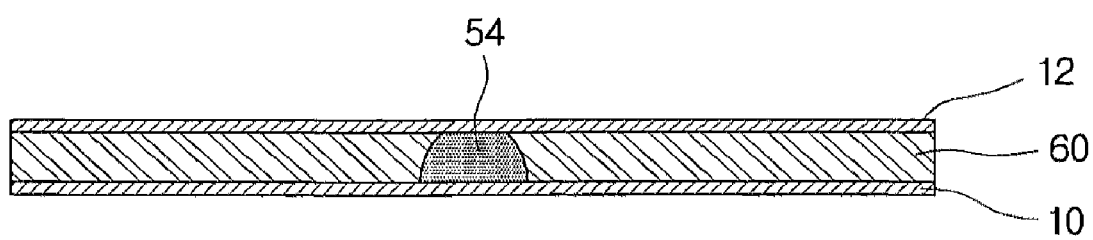
FIG. 1 is a cross-sectional view of a printed circuit board according to an embodiment of the invention.

The conductive paste, printed circuit board using the conductive paste, and method of manufacturing the printed circuit board according to certain embodiments of the invention will be described below in more detail with reference to the accompanying drawings. In the drawings, those components that are the same or are in correspondence are rendered the same reference numeral regardless of the figure number, and redundant explanations are omitted.

Figure 2:
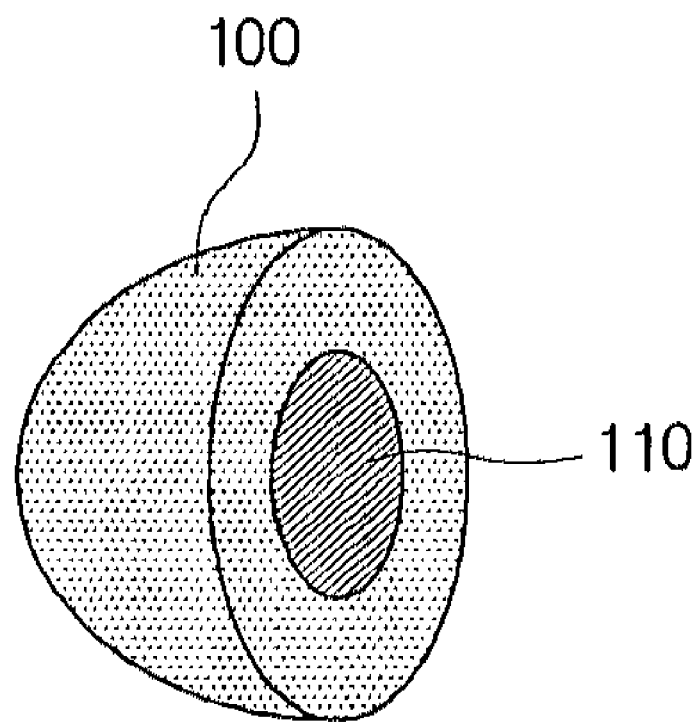
FIG. 2 is a schematic drawing of a polymer foam according to an embodiment of the invention.
Figure 3:
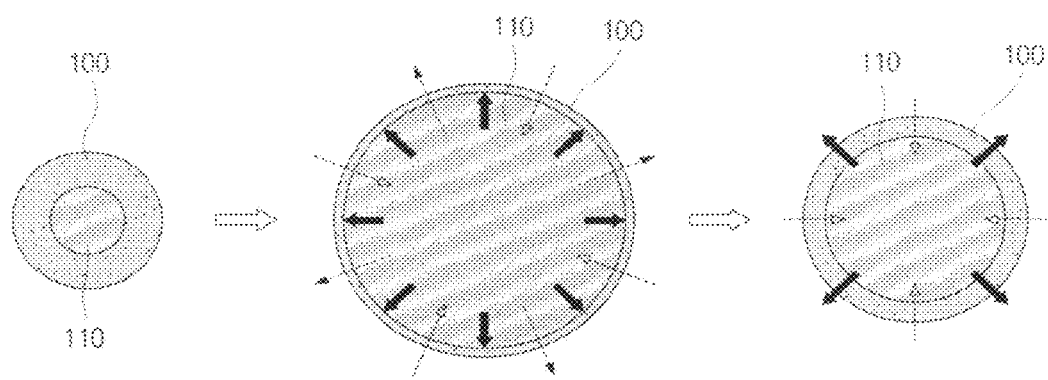
FIG. 3 is a schematic drawing of the state of a polymer foam according to an embodiment of the invention when there are changes in temperature.

FIG. 1 is a cross-sectional view of a printed circuit board according to an embodiment of the invention, FIG. 2 is a schematic drawing of a polymer foam according to an embodiment of the invention, and FIG. 3 is a schematic drawing of the state of a polymer foam according to an embodiment of the invention when there are changes in temperature.

In FIG. 1 to FIG. 3 are illustrated substrates 10, 12, a bump 54, an insulation layer 60, a polymer foam 100, and a foaming material 110.

A conductive paste according to this particular embodiment can reduce the number of printing operations to simplify the process, decrease process times, and improve reliability.

For this, a conductive paste according to this embodiment is composed mainly of conductive particles, a polymer, and a polymer foam.

Here, the conductive particles can be included in 80 to 90 parts by weight per 100 parts by weight of the conductive paste, while the mixture of the polymer and polymer foam can be included in 10 to 20 parts by weight per 100 parts by weight of the conductive. Compared to the related art, the content of the polymer, which acts as the binder for the conductive paste, may be decreased, and the content of the polymer foam may be increased correspondingly.

The conductive particles can be selected from a group consisting of silver, copper, tin, indium, and nickel, while the polymer can be at least one of an epoxy resin and a phenolmelamine resin.

As illustrated in FIG. 2, the polymer foam 100 can be implemented in the form of a foam cell, an in the center of the cell, a foaming material 110 may be included, which expands to create foam when it is heated to a particular temperature. Here, the foaming material 110 may be a material that can be made supercritical, such as hydrocarbons, alcohols, $CO_2$, $N_2O$, $H_2O$, and $NH_3$.

As illustrated in FIG. 3, the polymer foam 100 can be produced by having the foaming material inside the core of the foam cell expand at a temperature of 100 to 150° C. However, as illustrated in FIG. 3, the polymer foam 100 may contract again in the temperature range of 150 to 210° C.

When printing the conductive paste to form a bump on a substrate 10, which will be described in more detail later, performing a printing procedure just once or twice utilizing such expanding of the polymer foam 100 can provide an effect similar to performing a printing procedure four or five times without utilizing the expansion of the polymer foam 100. After the expansion of the polymer foam 100, the contracting of the polymer foam 100 can be used to readily implement an interlayer connection between the substrates 10, 12.

This improved conductive paste as described above can be used in implementing a printed circuit board. That is, as illustrated in FIG. 1, a bump 54 can be formed which penetrates through the insulation layer 60 between substrate 10 and substrate 12 and interconnects the substrates 10, 12.

Here, the substrate 10 and substrate 12 are illustrated, so that the embodiment of the invention can be described for a very simple structure. It is to be appreciated that more than two substrates can be used to implement a multiply layered printed circuit board.

The bump 54 that interconnects the substrates 10, 12 may be made of a conductive paste that includes conductive particles, a polymer, and a polymer foam. The substrates 10, 12 on which the bump 54 for interlayer connection will be formed, can be formed by performing a B2it process. Using the property of the polymer foam 100 of expanding when heat is applied, the bump printing process can be performed just once or twice to form the bump 54 to a size comparable to that formed by five repetitions of printing without using the polymer foam.

That is, when a predetermined temperature of 100 to 150° C. is applied, the polymer foam 100 within the printed bump 54 may expand, causing the overall volume of the bump 54 to increase, with the effect of the bump 54 being made comparable to a bump formed by printing four or five times.

The printed circuit board according to this embodiment may thus be structured to have a substrate 12 stacked on after expanding the printed bump, by applying a predetermined temperature, and then contracting the bump by a drying process, etc. Here, as the polymer foam 100 may utilize contracting and relaxing actions, there may be a lower risk of the bump 54 cracking when stacking the substrate 12, and when repeating the printing of the bump 54, there may be fewer irregularities, so that the positioning of the bump 54 can be made more accurate.

FIG. 4 is a flowchart of a method of manufacturing a printed circuit board according to an embodiment of the invention, and FIG. 5A to FIG. 5G are cross-sectional views representing a flow diagram of the process for manufacturing a printed circuit board according to an embodiment of the invention. In FIGS. 5A to 5G are illustrated substrates 10, 12, a mask 20, conductive paste 30, a squeegee 40, a bump 50, 52, 54, and an insulation layer 60.

According to this embodiment, the property of the polymer foam to expand as heat is applied to the conductive paste may be used so that the bump printing process can be performed just once or twice to form a bump to a size obtained by five repetitions of printing. As such, the number of printing repetitions can be drastically reduced, whereby the process can be simplified, the process times can be decreased, and reliability can be improved.

For this, a bump 50 may first be printed on one side of a substrate 10 using a conductive paste that contains conductive particles, polymers, and polymer foam (S10). An example of the procedures for printing the bump 50 is as illustrated in FIGS. 5A, 5B, and 5C.

As can be seen in the drawings, in using a B2it printing method, a mask 20 in which a hole is formed can be prepared over one side of the substrate 10, and the conductive paste 30 can be pushed using a squeegee 40, whereby the conductive paste 30 may be printed through the hole and onto the surface of the substrate 10.

Figure 5A:
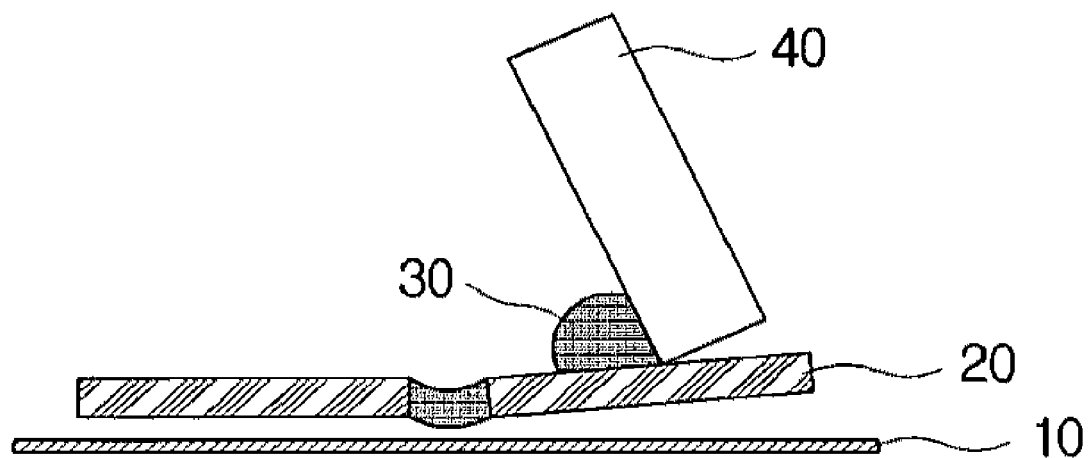
FIG. 5A, FIG. 5B, FIG. 5C, FIG. 5D, FIG. 5E, FIG. 5F, and FIG. 5G are cross-sectional views representing a flow diagram of the process for manufacturing a printed circuit board according to an embodiment of the invention.
Figure 5B:
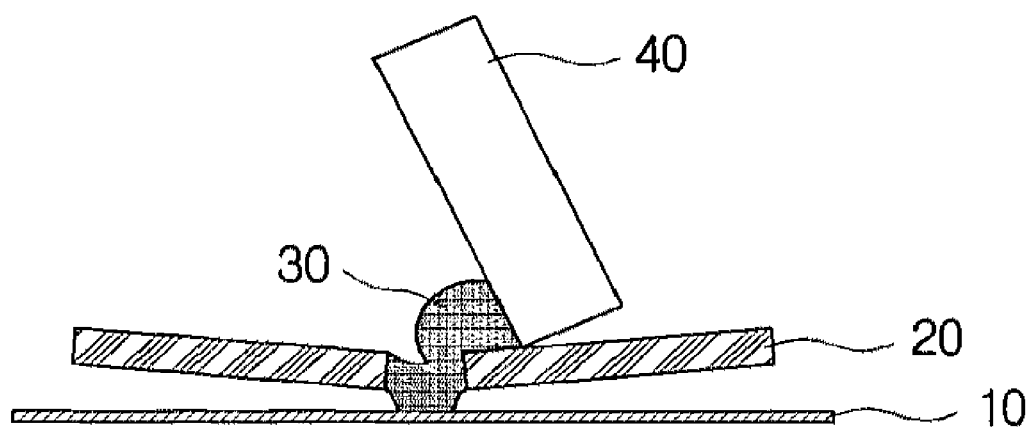
Figure 5C:
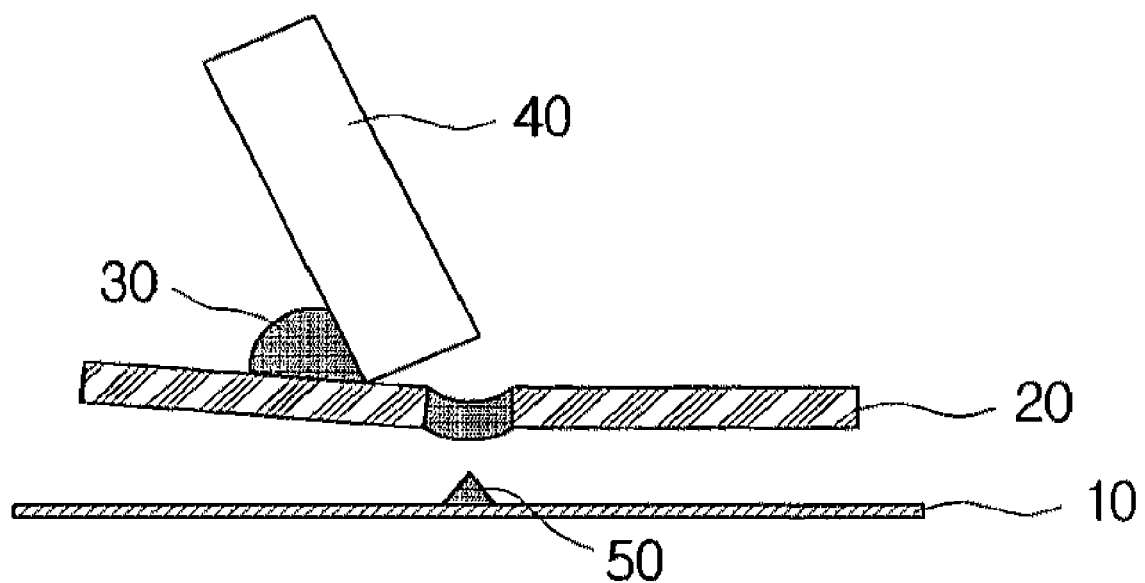
Figure 5D:
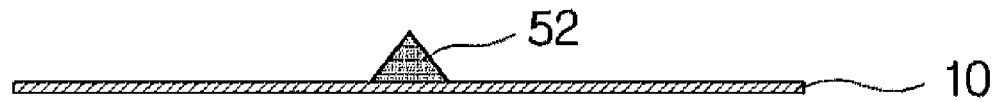

Then, the processes illustrated in FIGS. 5A, 5B, and 5C may be repeated, so that another bump 52 may be printed over the previously printed bump 50.

Here, the conductive paste 30 can include conductive particles, polymers, and polymer foam. Compared to the conventional paste, which includes only conductive particles and polymers, the conductive paste according to this embodiment includes the addition of polymer foam, by which one or two rounds of printing the bump can provide an effect similar to printing the conventional bump four or five times.

The conductive paste 30 can include 80 to 90 parts by weight of the conductive particles and 10 to 20 parts by weight of the mixture of the polymer and the polymer foam per 100 parts by weight of the conductive paste. Compared to the related art, the content of the polymer may be decreased by a certain amount, while the polymer foam may be added by a corresponding amount.

Here, the conductive particles can be made of silver, copper, tin, indium, nickel, etc., while the polymer can be made of at least one of an epoxy resin and a phenol-melamine resin.

The surface of the polymer foam can be coated with the conductive particles described above to form the conductive paste. By way of the metal layer of conductive particles coated on the surface of the polymer foam, the electrical conductivity may be increased when using the bump for interconnecting the substrates.

Figure 5E:
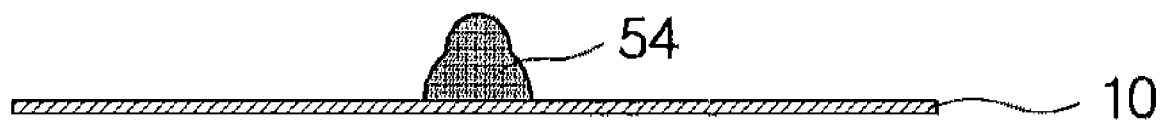

Next, as illustrated in FIG. 5E, the bump 52 thus formed may be made to expand by applying a predetermined temperature (S20). The predetermined temperature can be within a range of 100 to 150° C. (S22). If the temperature is below 100° C., the bump 54 may not be fully expanded, whereas if the temperature is over 150° C., the polymer foam forming the bump 54 may start contracting again and thus may not be fully expanded.

As the bump 54 expands, due to the expanding of the polymer foam, the size of the bump expanded after printing just once or twice can be made comparable to the size of a bump printed four or five times with the conventional conductive paste. Therefore, the process lead times can be decreased, and the amount of conductive paste 30 expended can be reduced by 50% or more, providing an effect of reduced manufacturing costs. Also, the problems of deviation in height of the bump and spreading of the bump, which are more likely to occur with more repetitions of printing, can be resolved to a certain degree.

A brief summary of the property of the polymer foam according to changes in temperature is that the polymer foam can be implemented in the form of a foam cell and can include a material in the inside core that expands to create foam. The foaming material may be such that can be made supercritical, for example by including materials such as hydrocarbons, alcohols, $CO_2$, $N_2O$, $H_2O$, and $NH_3$, etc.

It is possible to adjust the height of the bump 54 after expansion according to the amount of polymer foam added.

As described above, the foaming material may have the property of creating foam and expanding at a temperature of 100 to 150° C., but contracting again when more heat is applied to raise the temperature higher.

Figure 5F:
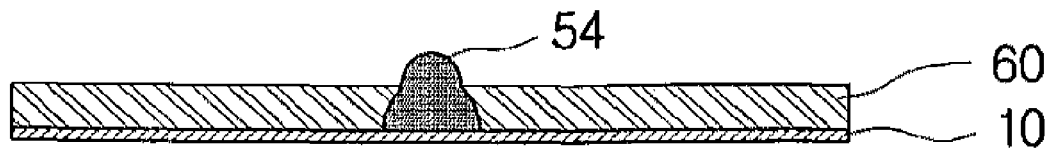

After applying heat to the printed bump 52 and thus expanding the bump 52, an insulation layer 60 may be stacked on one side of the substrate 10 (S30), as illustrated in FIG. 5F, such that the bump 54 penetrates the insulation layer 60.

Next, the bump 54 may be dried within a temperature range of 150 to 210° C. (S40). As described above, when more heat is applied to the expanded bump 54, the polymer foam may contract, so that the bump 54 also contracts.

If the drying temperature is below 150° C., the bump 54 may not be completely dried, so that the degree of contraction may be lowered, whereas if the drying temperature is over 210° C., the degree of contraction may exceed the normal range.

Figure 5G:
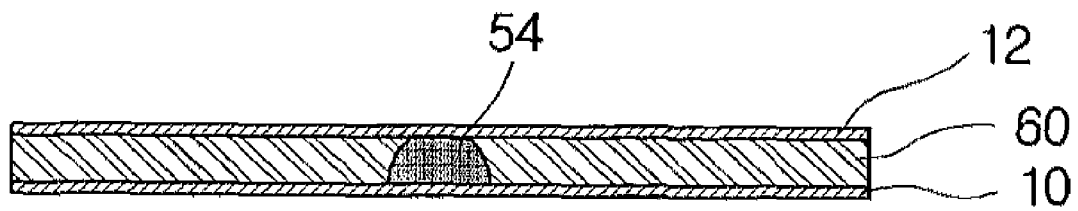

Afterwards, as illustrated in FIG. 5G, a substrate 12 may be formed on the insulation layer 60 (S50). Here, the polymer foam may contract with the drying of the bump 54, such that the bump 54 may be put in contact with the substrate 12 formed on the insulation layer 60, and consequently the substrate 10 can be interconnected with the substrate 12 formed on the insulation layer 60.

Also, since the polymer foam may undergo contracting and relaxing actions according to the changes in temperature, and thus partial voids may be formed within the bump 54, the bump 54 may contract when forming the substrate 12 on the insulation layer 60, so that the occurrence of cracks on the bump 54 can be prevented.

Furthermore, whereas numerously repeated printing can cause a bump 54 to lean in one direction, embodiments of the present invention may reduce the number of repetitions and prevent such an occurrence, allowing greater accuracy in printing the bump 54.

According to certain embodiments of the invention as set forth above, by using an improved conductive paste that includes conductive particles, a polymer, and polymer foam, one or two rounds of printing, in the bump printing process, can provide a size comparable to five rounds of printing without using the improved conductive paste.

In addition, as the number of rounds of printing repetitions can be drastically reduced, the process can be simplified, the process lead times can be decreased, and the amount of conductive paste expended can be reduced, for savings in manufacture costs.

Moreover, the problems of height deviation and spreading of the bump, which are more likely to occur with more repetitions of printing, can be resolved to a certain degree, and the contracting and relaxing actions of the polymer foam can be utilized to prevent cracks on the bump when stacking the substrate.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A conductive paste comprising:
    conductive particles;
    a polymer;
    a polymer foam, the polymer foam being formed in a shape of a cell and containing a foaming material that expands and creates foam when heated to a predetermined temperature, the conductive particles being coated on a surface of the polymer foam so as to form a metal layer of conductive particles coated on a surface of the polymer foam; and
    wherein a content of the conductive particles is 80 to 90 parts by weight per 100 parts by weight of the conductive paste, and a content of a mixture of the polymer and the polymer foam is 10 to 20 parts by weight per 100 parts by weight of the conductive paste.

2. The conductive paste of claim 1, wherein the conductive particles include at least one selected from a group consisting of silver, copper, tin, indium, and nickel.

3. The conductive paste of claim 1, wherein the polymer includes at least one selected from a group consisting of an epoxy resin and a phenol-melamine resin.

4. The conductive paste of claim 1, wherein the foaming material includes at least one selected from a group consisting of hydrocarbons, alcohols, $CO_2$, $N_2O$, $H_2O$, and $NH_3$.

5. The conductive paste of claim 1, wherein the predetermined temperature lies within a temperature range of 100 to 150° C.

6. The conductive paste of claim 5, wherein, after expanding, the polymer foam contracts when within a temperature range of 150 to 210° C.

7. A printed circuit board comprising:
    a plurality of substrates;
    an insulation layer placed between the substrates;
    a bump penetrating the insulation layer and interconnecting the substrates,
    wherein the bump is made from a conductive paste, the conductive paste comprising:
        conductive particles, a polymer, and a polymer foam the polymer foam being formed in a shape of a cell and containing a foaming material that expands and creates foam when heated to a predetermined temperature, the conductive particles being coated on a surface of the polymer foam so as to form a metal layer of conductive particles coated on a surface of the polymer foam; and
    wherein a content of the conductive particles is 80 to 90 parts by weight per 100 parts by weight of the conductive paste, and a content of a mixture of the polymer and the polymer foam is 10 to 20 parts by weight per 100 parts by weight of the conductive paste.

8. The printed circuit board of claim 7, wherein the conductive particles include at least one selected from a group consisting of silver, copper, tin, indium, and nickel.

9. The printed circuit board of claim 7, wherein the polymer includes at least one of an epoxy resin and a phenol-melamine resin.

10. The printed circuit board of claim 7, wherein the foaming material includes at least one selected from a group consisting of hydrocarbons, alcohols, $CO_2$, $N_2O$, $H_2O$, and $NH_3$.

11. The printed circuit board of claim 7, wherein the predetermined temperature lies within a temperature range of 100 to 150° C.

12. A method of manufacturing a printed circuit board, the printed circuit board comprising a first substrate and a second substrate stacked together with an insulation layer interposed in-between, and a bump penetrating the insulation layer to electrically connect the first substrate and the second substrate, the method comprising:
    forming the bump on one side of the first substrate by printing a conductive paste, the conductive paste comprising conductive particles, a polymer, and a polymer foam the polymer foam being formed in a shape of a cell and containing a foaming material that expands and creates foam when heated to a predetermined temperature, the conductive particles being coated on a surface of the polymer foam so as to form a metal layer of conductive particles coated on a surface of the polymer foam;
    expanding the bump;
    stacking the insulation layer on the one side of the first substrate;
    forming the second substrate on the insulation layer; and
    wherein a content of the conductive particles is 80 to 90 parts by weight per 100 parts by weight of the conductive paste, and a content of a mixture of the polymer and the polymer foam is 10 to 20 parts by weight per 100 parts by weight of the conductive paste.

13. The method of claim 12, wherein the conductive particles include at least one selected from a group consisting of silver, copper, tin, indium, and nickel.

14. The method of claim 12, wherein the polymer includes at least one of an epoxy resin and a phenol-melamine resin.

15. The method of claim 12, wherein the expanding is performed by heating the bump to a predetermined temperature.

16. The method of claim 15, wherein the predetermined temperature lies within a temperature range of 100 to 150° C.

17. The method of claim 12, wherein the foaming material includes at least one selected from a group consisting of hydrocarbons, alcohols, $CO_2$, $N_2O$, $H_2O$, and $NH_3$.

18. The method of claim 12, further comprising, after stacking:
    drying the bump.

19. The method of claim 18, wherein the drying is performed within a temperature range of 150 to 210° C.

* * * * *

UNITED STATES PATENT AND TRADEMARK OFFICE
CERTIFICATE OF CORRECTION

PATENT NO. : 8,298,447 B2
APPLICATION NO. : 12/076117
DATED : October 30, 2012
INVENTOR(S) : Ki-Hwan Kim et al.

It is certified that error appears in the above-identified patent and that said Letters Patent is hereby corrected as shown below:

Column 7, Line 26, In Claim 4, delete "CO2, N2O, H2O, and NH3." and insert -- $CO_2$, $N_2O$, $H_2O$, and $NH_3$. --, therefor.
Column 8, Lines 6-7, In Claim 10, delete "CO2, N2O, H2O, and NH3." and insert -- $CO_2$, $N_2O$, $H_2O$, and $NH_3$. --, therefor.
Column 8, Line 48 (Approx.), In Claim 17, delete "CO2, N2O, H2O, and NH3." and insert -- $CO_2$, $N_2O$, $H_2O$, and $NH_3$. --, therefor.

Signed and Sealed this
Twenty-sixth Day of February, 2013

Teresa Stanek Rea
*Acting Director of the United States Patent and Trademark Office*